(12) United States Patent
Duetemeyer et al.

(10) Patent No.: US 8,405,206 B1
(45) Date of Patent: Mar. 26, 2013

(54) LOW-INDUCTIVE SEMICONDUCTOR MODULE

(75) Inventors: Thomas Duetemeyer, Soest (DE); Thomas Auer, Soest (DE); Georg Braeker, Warstein (DE); Ronny Herms, Calvoerde (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/249,427

(22) Filed: Sep. 30, 2011

(51) Int. Cl.
*H01L 23/34* (2006.01)

(52) U.S. Cl. ............... 257/724; 257/E21.575; 257/693; 257/698; 257/776; 438/107

(58) Field of Classification Search .......... 257/E21.575, 257/E23.078, E23.079, 690–693, 698, 712, 257/713, 723–725, 728, 773, 776; 438/107, 438/109, 110, 121

See application file for complete search history.

(56) References Cited

U.S. PATENT DOCUMENTS

| | | | | |
|---|---|---|---|---|
| 4,907,068 A | * | 3/1990 | Amann et al. ................. | 257/724 |
| 5,471,089 A | * | 11/1995 | Nagatomo et al. ............ | 257/691 |
| 5,761,040 A | * | 6/1998 | Iwasa et al. ................... | 361/704 |
| 6,054,765 A | * | 4/2000 | Eytcheson et al. ............ | 257/724 |
| 6,525,950 B1 | * | 2/2003 | Shirakawa et al. ........... | 363/144 |
| 6,791,854 B2 | * | 9/2004 | Shirakawa et al. ........... | 363/147 |
| 6,885,097 B2 | * | 4/2005 | Maeno et al. ................. | 257/698 |
| 7,161,235 B2 | * | 1/2007 | Maeno .......................... | 257/691 |
| 7,242,584 B2 | * | 7/2007 | Kroneder ..................... | 361/714 |
| 7,279,963 B2 | * | 10/2007 | Passe et al. ................... | 327/566 |
| 2009/0085219 A1 | | 4/2009 | Bayerer | |

OTHER PUBLICATIONS

Bayerer, R. et al. "Power Circuit Design for Clean Switching", CIPS 2010—6th International Conference on Integrated Power Electronics Systems, Mar. 16-18, 2010, Nuremberg, Germany.

* cited by examiner

*Primary Examiner* — Chris Chu
(74) *Attorney, Agent, or Firm* — Murphy, Bilak & Homiller, PLLC (57) ABSTRACT

A semiconductor module includes a module housing, at least one substrate, a number N of at least two controllable power semiconductor chips arranged inside the module housing and one after another in a lateral direction, a single main load terminal arranged outside the module housing and electrically connected to the first main electrodes, and an auxiliary terminal arranged outside the module housing and electrically connected to the first main electrodes via an auxiliary terminal connecting conductor.

14 Claims, 7 Drawing Sheets

LOW-INDUCTIVE SEMICONDUCTOR MODULE

FIELD OF TECHNOLOGY

The invention relates to semiconductor modules.

BACKGROUND

Power electronics modules are semiconductor modules used in power electronics circuitry. Power electronics modules are employed typically in vehicular, rail and industrial applications, for example in inverters or rectifiers. They likewise find application in the form of energy generation and transmission. The semiconductor components contained in the power electronics modules may involve e.g. semiconductor chips including a Transistor, an insulated gate (IGBT), a metal oxide field-effect transistor (MOSFET), a junction field-effect transistor (JFET), a thyristor, or a diode. These semiconductor components may vary as to their voltage and current handling capacity.

Each of those semiconductor components has a first main electrode, a second main electrode, and a load path formed between the first main electrode and the second main electrode. For instance, the first and second main electrode may be drain and source, source and drain, emitter and collector, collector and emitter, anode and cathode, or cathode and anode, respectively.

Many of those semiconductor components additionally have a control electrode for controlling an electric current through the load path of the respective component. Such semiconductor components are also referred to controllable semiconductor components.

In order to increase the switching capacity, two or more controllable semiconductor components may be arranged in the form of individual semiconductor chips in a common module housing and electrically connected in parallel. To this, the first main electrodes are electrically connected in parallel inside the module housing and connected to at least one common, external first main load terminal. The second main electrodes are also electrically connected in parallel inside the module housing and connected to a common, external second main load terminal. Further, the control electrodes are electrically connected in parallel inside the module housing and connected to a common control terminal. In the sense of the present invention, a terminal is referred to as an "external" terminal if it is arranged outside the module housing.

In addition, each of the controllable semiconductor components, and, accordingly, each of the respective semiconductor chips may be connected at its respective first main load electrode via an auxiliary contact that is used, together with the control electrode of the respective controllable semiconductor chip, for providing that semiconductor chip with a control voltage that serves the control an electric current through the load path. To this, the auxiliary contacts of the semiconductor chips connected in parallel are also connected to one another inside the module housing and connected to a common external auxiliary terminal.

During operation, a control voltage for controlling all parallel semiconductor chips is applied between the external auxiliary terminal and the external control terminal and distributed to the individual semiconductor chips using an arbitrary wiring inside the module housing.

In particular at high currents through the load paths, the electric potential along the wiring that electrically connects the first main load terminals may drop due to the unavoidable ohmic resistance of the wiring. This causes the different semiconductor chips to require different control voltages for being switched on, that is, for switching the respective load paths from an electrically blocking state to an electrically high conductive state.

This however may cause different semiconductor chips not to be commonly and simultaneously switched on or off. In the worst case it may happen that during a switching event in which all semiconductor chips are intended to be commonly switched on or off, some of the semiconductor chips remain in their previous off or on state. As a consequence, the conducting ones of the semiconductor chips, that is, the semiconductor chips in the on state, are required to carry the total current through the module.

Therefore, there is a need for an improved semiconductor module.

SUMMARY

According to one embodiment, a semiconductor module comprises a module housing, at least one substrate, a number N of at least two controllable power semiconductor chips arranged inside the module housing and one after another in a lateral direction, a single main load terminal arranged outside the module housing and electrically connected to first main electrodes, and an auxiliary terminal arranged outside the module housing and electrically connected to the first main electrodes via an auxiliary terminal connecting conductor. The number N of at least two controllable power semiconductor chips may be even or odd. Further, N is greater than or equal 2, and may be greater than or equal 3, greater than or equal 4, greater than or equal 5, or greater than or equal 6.

Each of the at least one substrates has a dielectric insulation carrier and a plane topside metallization layer attached to the insulation carrier and which includes a number of conductor tracks.

Each of the number of N controllable power semiconductor chips is arranged on the top metallization layer of one of the substrates and includes a first main electrode, a second main electrode, a load path formed between the first main electrode and the second main electrode, and a control electrode for controlling an electric current through the load path. Then, the first main electrodes are electrically connected to one another, the second main electrodes are electrically connected to one another, and the control electrodes are electrically connected to one another.

The auxiliary terminal connecting conductor is connected to one of the at least one topside metallization layer at a connection location of that topside metallization layer. The main load terminal is spaced distant from the connection location in the lateral direction at a distance that is less than or equal to the smallest repeat distance that occurs between any two adjacent ones of the power semiconductor chips in the lateral direction.

According to another embodiment, a semiconductor module comprises a module housing, at least one substrate, a number N of at least two controllable power semiconductor chips arranged inside the module housing and one after another in a lateral direction, two first main load terminals arranged outside the module housing, wherein a first one of the first main load terminals is electrically connected to the first main electrodes via a first main terminal connecting conductor and a second one of the first main load terminals is electrically connected to the first main electrodes via a second main terminal connecting conductor, a second main load terminal arranged outside the module housing and electrically connected to the second main electrodes, and an auxiliary terminal arranged outside the module housing and electrically connected to the first main electrodes via an auxiliary terminal connecting conductor.

Each of the at least one substrates has a dielectric insulation carrier and a plane topside metallization layer attached to the insulation carrier and which includes a number of conductor tracks.

Each of the number of N controllable power semiconductor chips is arranged on the top metallization layer of one of the substrates and includes a first main electrode, a second main electrode, a load path formed between the first main electrode and the second main electrode, and a control electrode for controlling an electric current through the load path. Then, the first main electrodes are electrically connected to one another, the second main electrodes are electrically connected to one another, and the control electrodes are electrically connected to one another.

The auxiliary terminal connecting conductor is connected to one of the at least one topside metallization layer at a connection location of that topside metallization layer.

The module is configured such that if the first main load terminals are short-circuited outside the module housing, a first terminal of an ohmic load is connected to both first main load terminals, a first electric supply potential is connected to a second terminal of the ohmic load, a second electric supply potential is connected to the second main load terminal, each of the power semiconductor chips is fully switched on such that through the load path of each of the power semiconductor chips an electric current caused by the first and second electric supply potentials establishes, and a total electric current through the ohmic load establishes which is the sum of a first partial current through the first main terminal connecting conductor and a second partial current through the second main terminal connecting conductor wherein the first partial current is greater than the second partial current.

The first main load terminal is spaced distant from the connection location in the lateral direction at a distance that is less than or equal to the smallest repeat distance that occurs between any two adjacent ones of the power semiconductor chips in the lateral direction.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the Figures. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
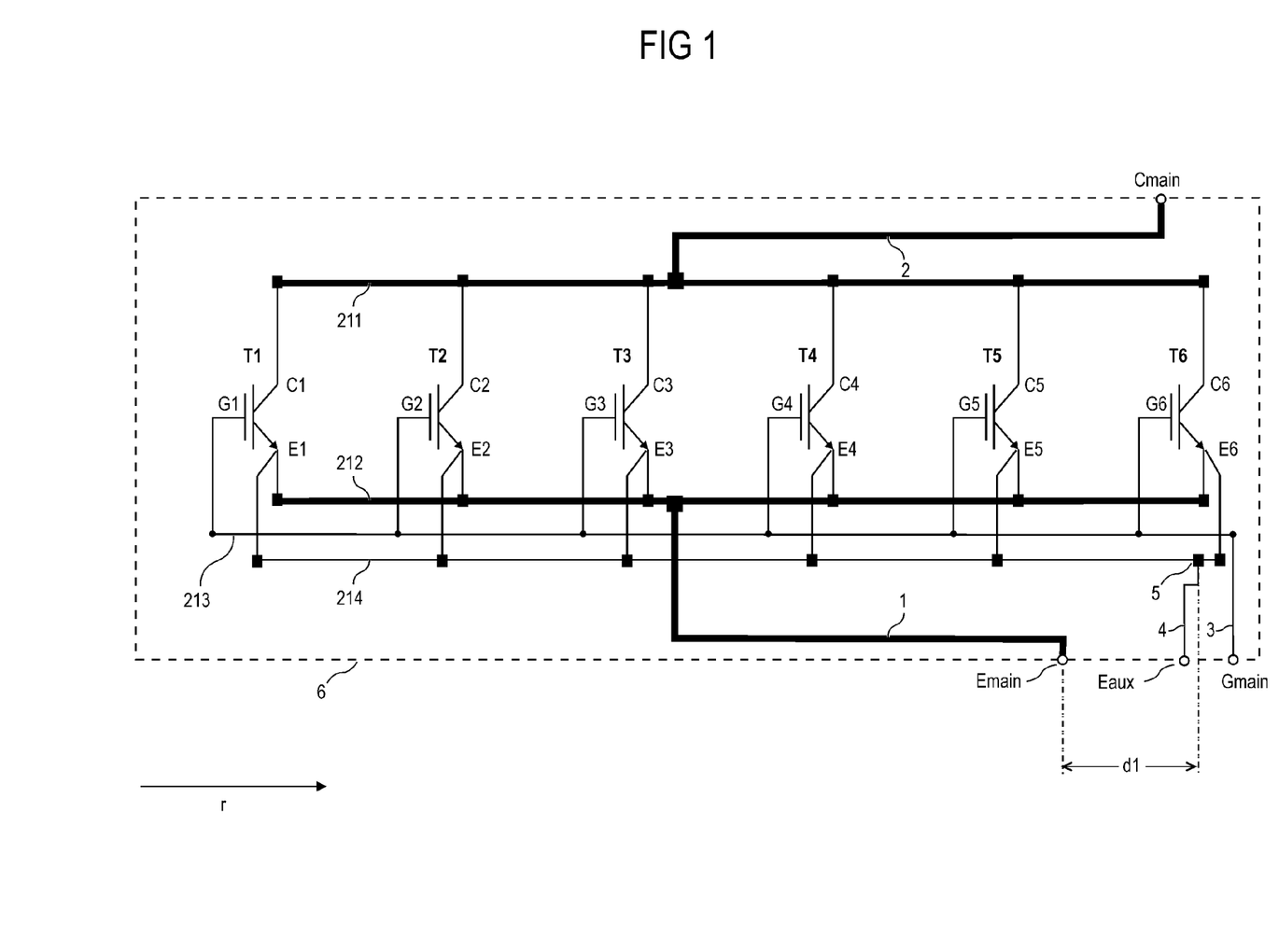
FIG. 1 is a circuit diagram of a semiconductor module having a single main load terminal arranged outside the module housing and electrically connected to first main electrodes.
Figures 2, 3:
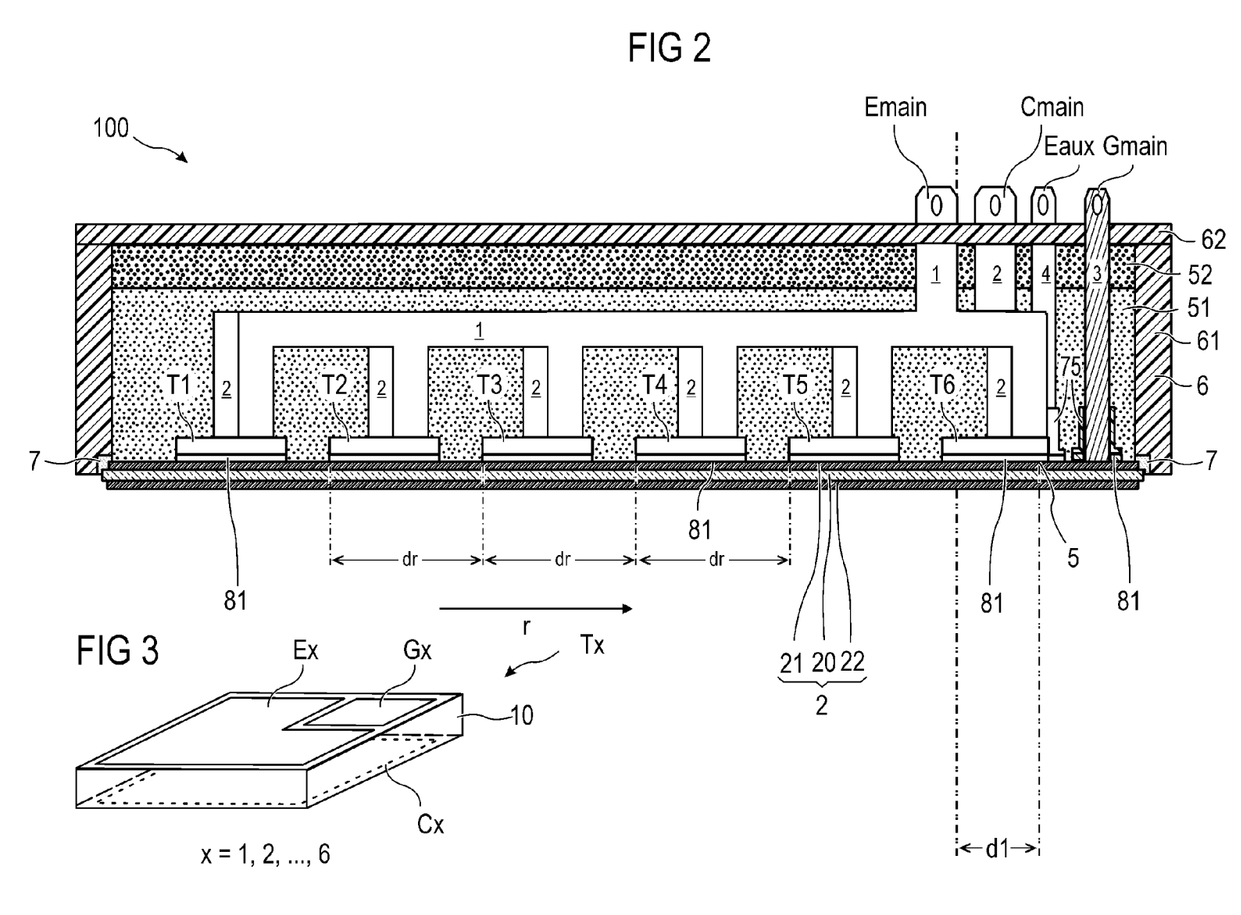
FIG. 2 is a vertical section through a semiconductor module according to the circuit diagram of FIG. 1.
FIG. 3 is perspective view of a controllable semiconductor chip.
Figure 4:
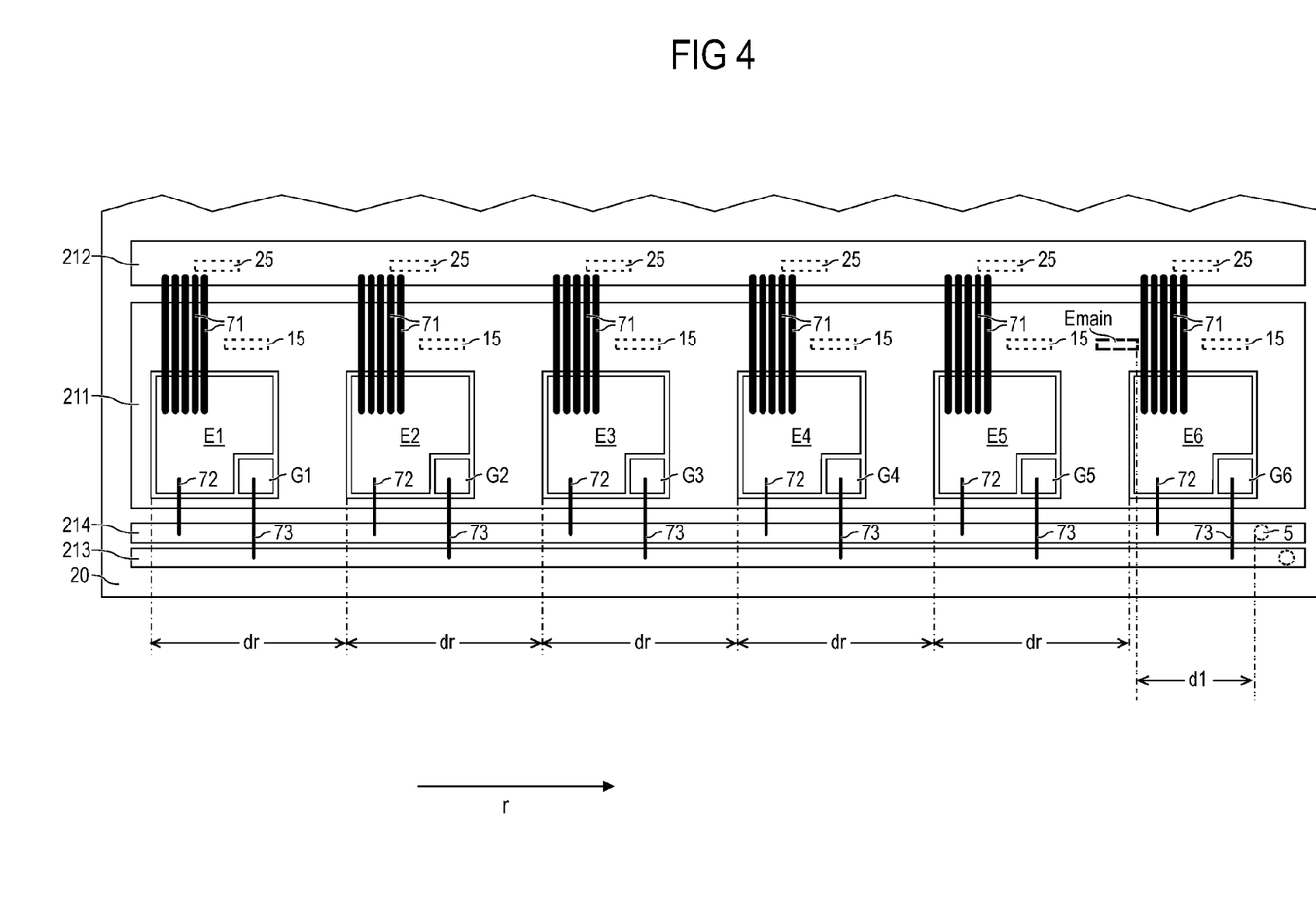
FIG. 4 is a top view of a section of the substrate of FIG. 2 and the semiconductor chips arranged thereon.

Referring now to FIGS. 1 to 4, in FIG. 1 there is illustrated a circuit diagram of a semiconductor module 100. FIG. 2 is a vertical section through an exemplary semiconductor module 100 according to the circuit diagram of FIG. 1 and FIG. 4 is a top plan view of a section of the substrate 2 of FIG. 2 and the semiconductor chips T1 . . . T6 arranged thereon.

In FIG. 1, a module housing 6 is schematically illustrated by a dashed rectangle. The circuit diagram of FIG. 1 includes a number of circuit nodes. Whereas conventional circuit nodes are marked by a filled circle, some of the circuit nodes are marked as filled rectangles. Those filled rectangles indicate that the respective circuit nodes may be located on a topside metallization layer 21 of a substrate 2 (see FIGS. 2 and 4).

The substrate 2 has a dielectric insulation carrier 20, a patterned plane topside metallization layer 21 that is attached to the insulation carrier 20 and that comprises a number of conductor tracks 211, 212, 213, 214. On its side facing away from the topside metallization layer 21, a plane bottom metallization layer 22 is attached to the insulation carrier 20. Optionally, the insulation carrier 20 may be made of ceramics like Al2O3 (alumina), AlN (aluminum nitride), BeO (beryllium oxide), SiC (silicon carbide), etc. The metallizations 21 and 22 may be made of copper, aluminum, an alloy with copper or aluminum, or comprise on of these materials, or of any other electrically highly conductive material or material composition. For instance, the substrate 2 may be a DCB substrate (DCB=direct copper bonded), a AMB substrate (AMB=active metal brazed), or a DAB substrate (DAB=direct aluminum bonded). Optionally, the topside metallization layer 21 and/or the bottom metallization layer 22 may superficially be coated with at least one thin layer consisting of or composed of one or more of the following materials in order to improve the solderability: silver, NiAu, NiPd, NiPdAu. The substrate 2 is joined to the housing an elastic adherent 7, for instance a silicone.

On the substrate 2, a number N of at least two controllable power semiconductor chips T1 . . . T6 are arranged inside the module housing 6 and, in a lateral direction r, one after another. In the illustrated embodiment, the power semiconductor chips T1 . . . T6 are arranged in a row. In other embodiments however, one or more of the power semiconductor chips T1 ... T6 could be staggered perpendicular to the lateral direction r.

Any two adjacent ones of the power semiconductor chips T1 ... T6 are, in the lateral direction r, spaced distant from one another at certain repeat distance dr. In the illustrated embodiment, the repeat distances dr between any two adjacent power semiconductor chips T1 ... T6 is identical. Alternatively, different repeat distances dr may be used. In any case, it is possible to determine the smallest of all repeat distances dr which will be used later.

FIG. 3 schematically shows the semiconductor chips T1 ... T6 each having a semiconductor body 10, a first main electrode E1 ... E6, a second main electrode C1 ... C6, a load path formed between the first main electrode E1 ... E6 and the second main electrode C1 ... C6, and a control electrode G1 ... G6 for controlling an electric current through the load path. The hidden second main electrode C1 ... C6 and some of the hidden edges of the semiconductor body 10 are shown as dashed lines.

As illustrated, the semiconductor chips T1 ... T6 may be designed as vertical power semiconductor chips with the respective first and second main electrode E1 ... E6, C1 ... C6 arranged on opposing sides of the respective semiconductor body 10. The respective control electrodes Gx are arranged on the same side of the semiconductor body 10 as the respective first main electrode E1 ... H. In other embodiments, the first and second main electrodes E1 ... E6, C1 ... C6 may be arranged on the same side of the semiconductor body 10.

Each of the number of N controllable power semiconductor chips T1 ... T6 is arranged on the top metallization layer 21 of the substrate 2 which can be seen in FIG. 2 and the top view of the substrate 2 of FIG. 4.

The second main electrodes C1 ... C6 are electrically connected to one another by a further conductor path 211 via a patterned connection layer 81 (FIG. 2) which may be, for instance, a solder, an electrically conductive adhesive or a sintered layer comprising silver.

The second main electrodes C1 ... C6 are electrically connected to one another by a conductor path 214 to which the second main electrodes C1 ... C6 are wire bonded via bonding wires 72.

The first main electrodes E1 ... E6 are electrically connected to one another by a conductor path 212 to which the main electrodes C1 ... C6 are wire bonded via bonding wires 71.

Further, the control electrodes G1 ... G6 are electrically connected to one another by a conductor path 213 to which the control electrodes G1 ... G6 are wire bonded via bonding wires 73.

In FIG. 2, the bonding wires 71, 72, 73 are suppressed. Instead of or in addition to bonding wires 71, 72, 73, any other electrically conductive connection element may be used. The bonding wires 72 form auxiliary electrodes.

Each of the conductor paths 211, 212, 213 and 214 may be, independently from one another, a section of the topside metallization layer 21 or include a section of the topside metallization layer 21. In FIG. 2, the conductor paths 211, 212 and 214 are hidden behind the conductor path 213.

A single main load terminal Emain is arranged outside the module housing 6 and electrically connected to the first main electrodes E1 ... E6 by a first main terminal connecting conductor 1. A second main load terminal Cmain is also arranged outside the module housing 6 and electrically connected to the second main electrodes C1 ... C6 by a second main terminal connecting conductor 2. As illustrated in FIG. 2, both the first and second main terminal connecting conductors 1, 2 may be formed as bus bars. However, any other suitable electrically conductive element may be used instead. As is illustrated in the top view of FIG. 4, the bus bar 1 has a number of connection areas 15 on the conductor track 211 at which it is electrically connected to the conductor track 211. Similarly, the bus bar 2 has a number of connection areas 25 on the conductor track 212 at which it is electrically connected to the conductor track 212. Also indicated is the position of the first main load terminal Emain.

A control terminal Gmain is arranged outside the module housing 6 and electrically connected to the control electrodes G1 ... G6 via an control terminal connecting conductor 3, and an auxiliary terminal Eaux is arranged outside the module housing 6 and electrically connected to the first main electrodes E1 ... E6 via an auxiliary terminal connecting conductor 4.

As can be seen from FIG. 2, the first main terminal connector 1 and the main load terminal Emain may optionally be made of one piece. In the same way, the second main terminal connector 2 and the main load terminal Cmain may optionally be made of one piece. Then, the control terminal connecting conductor 3 and the control terminal Gmain may optionally be made of one piece. Further, the auxiliary terminal connecting conductor 4 and the auxiliary terminal Eaux may optionally be made of one piece.

The auxiliary terminal connecting conductor 4 may be a contact pin that is plugged into a sleeve 75 (FIG. 2) which is electrically connected to the topside metallization 21 by a connection layer 81 which may be, for instance, a solder or an electrically conductive adhesive. In other embodiments however, the auxiliary terminal connecting conductor 4 may be a straight or bent metal sheet, a wire, a bonding wire, a bonding ribbon, a contact spring, etc.

The auxiliary terminal connecting conductor 4 is connected to the at least one topside metallization layer 21 at a connection location 5 (see FIG. 4, dashed circle) on the conductor path 214. Optionally, the conductor path 214 may run completely (as illustrated in FIG. 4), substantially or partly in the lateral direction r.

In order to reduce the above mentioned potential drop that occurs in particular at high currents, the main load terminal Emain is spaced distant from the connection location 5 in the lateral direction r at a distance d1 that is less than or equal to the smallest repeat distance dr that occurs between any two adjacent ones of the power semiconductor chips T1 ... T6 in the lateral direction r.

Figure 5:
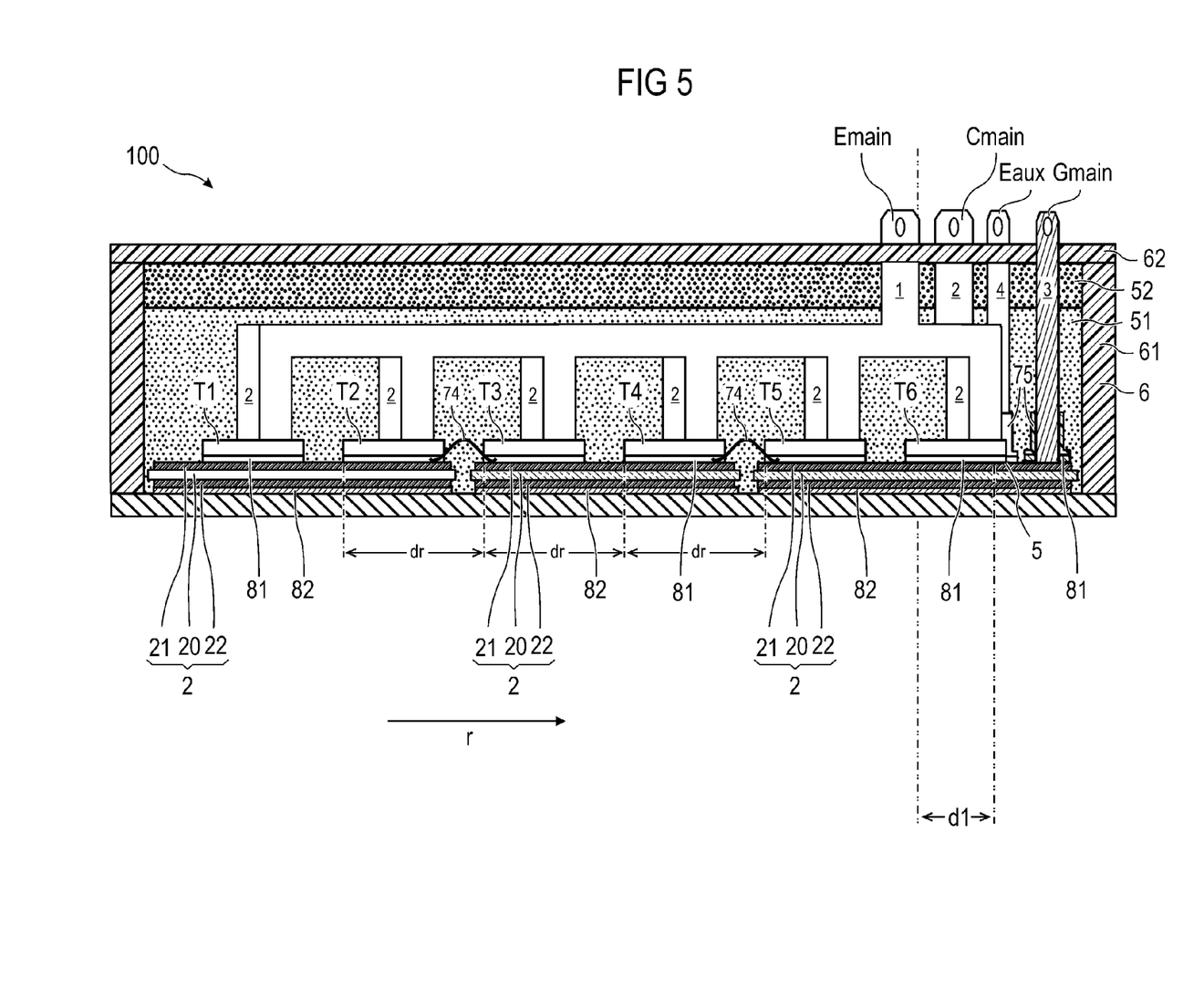
FIG. 5 is a vertical section through a semiconductor module according to the circuit diagram of FIG. 1, wherein the semiconductor chips are arranged on more than one substrate.

A further embodiment of a power semiconductor module 100 according to the circuit diagram of FIG. 1 is illustrated in FIG. 5. The power semiconductor module 100 of FIG. 5 is identical to the power semiconductor module 100 of FIGS. 1 and 2 with the exception that there are three individual substrates 2 electrically connected by use of bonding wires 74 instead of only a single substrate. However, the number of substrates could be also 2, 4 or more than 4.

Each of these substrates 2 has an insulation carrier 20 with a plane, patterend topside metallization layer 21 and an optional plane bottom metallization layer 22. Each of the substrates 2 of FIG. 5 may be designed in the same manner as the substrate 2 of FIG. 2. This particularly applies for the insulation carrier 20 and the metallization layers 21 and 22.

Figure 6:
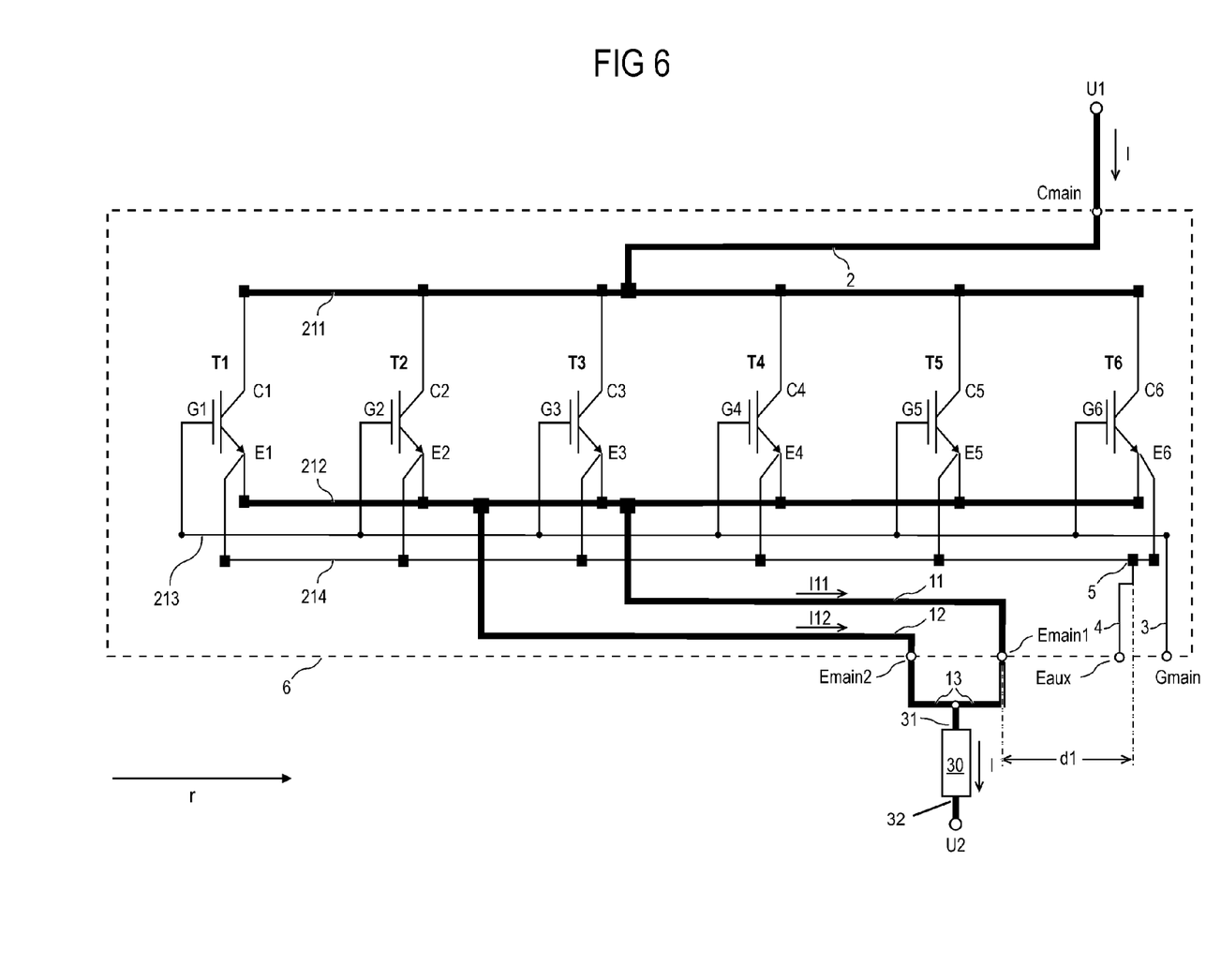
FIG. 6 is a circuit diagram of a semiconductor module having two main load terminals arranged outside the module housing and electrically connected to first main electrodes.
Figure 7:
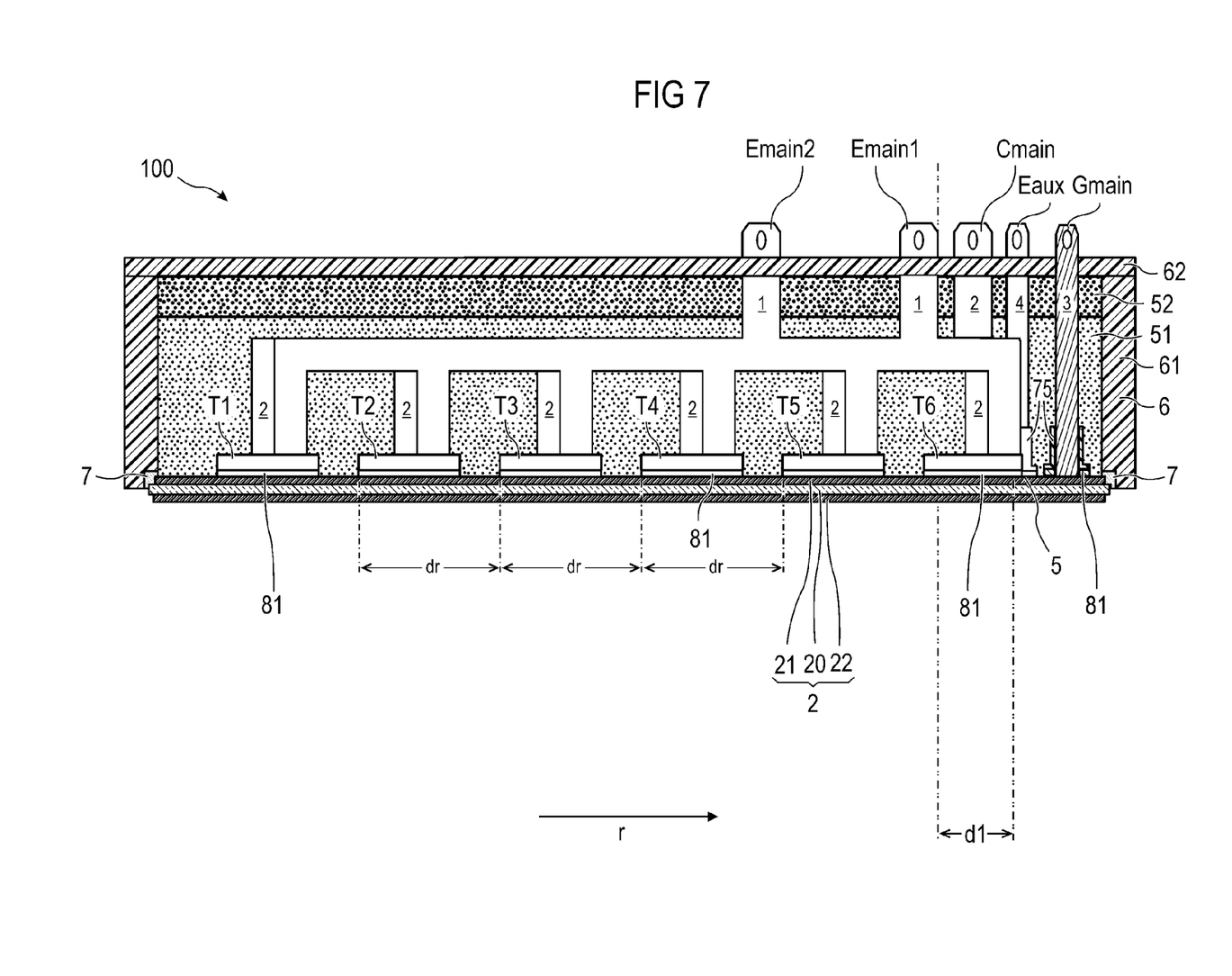
FIG. 7 is a vertical section through a semiconductor module according to the circuit diagram of FIG. 6.

Referring now to FIG. 6 there is illustrated a circuit diagram of a semiconductor module 100 that is connected to an ohmic load 30 and to electric supply potentials U1 and U2. FIG. 7 is a section through a power semiconductor module 100 according to FIG. 6. According to FIG. 1, the circuit nodes marked as filled rectangles indicate that the respective circuit nodes may be located on a topside metallization layer 21 of one of the substrates 2.

Compared to the power semiconductor module 100 of FIG. 1, the power semiconductor module 100 of FIG. 6 has two first main load terminals Emain1 and Emain2 that are arranged outside the module housing 6 and electrically connected to the first main electrodes E1 . . . E6 instead of only a single main load terminal Emain that is arranged outside the module housing 6 and electrically connected to the first main electrodes E1 . . . E6. The first main load terminals Emain1 and Emain2 are electrically connected to the first main electrodes E1 . . . E6 via main terminal connecting conductors 11 and 12, respectively.

Outside the module housing 6, the first main load terminals Emain1 and Emain2 are short-circuited via a short circuit connector 13. The ohmic load 30 has a first terminal 31 and a second terminal 32. The first terminal 31 is electrically connected to both first main load terminals Emain1 and Emain2 via the short circuit connector 13.

The second main load terminal Cmain is electrically connected to a first electric supply potential U1. The second terminal 32 of the ohmic load 30 is electrically connected to a second electric supply potential U2 that is different from the first supply potential U1. Each of the power semiconductor chips T1 . . . T6 is fully switched on by a suitable control signal (not shown) applied between the an auxiliary terminal Eaux and the control terminal Gmain such that through the load path of each of the power semiconductor chips T1 . . . T6 an electric current caused by the first and second electric supply potentials U1, U2 establishes.

As a consequence, a total electric current I through the ohmic load 30 establishes which is the sum of a first partial current I11 through the first main terminal connecting conductor 11 and a second partial current I12 through the second main terminal connecting conductor 12.

In order to reduce the above mentioned potential drop that occurs in particular at high currents, the connection location 5 is chosen to have, in the lateral direction r, a small distance d1 to that one of the first main load terminals Emain1 and Emain2 that terminates at one of the main terminal connecting conductors 11 and 12 conducting the greater of the partial currents I11 and I12.

Assuming that the first partial current I11 is greater than the second partial current I12, the connection location 5 is placed such that the distance d1 between the first main load terminal Emain1 and the connection location 5 in the lateral direction r is less than or equal to the smallest repeat distance dr that occurs between any two adjacent ones of the power semiconductor chips T1 . . . T6 in the lateral direction r.

If otherwise the second partial current I12 is greater than the first partial current I11, the connection location 5 is placed such that the distance d1 between the second main load terminal Emain2 and the connection location 5 in the lateral direction r is less than or equal to the smallest repeat distance dr that occurs between any two adjacent ones of the power semiconductor chips T1 . . . T6 in the lateral direction r.

Figure 8:
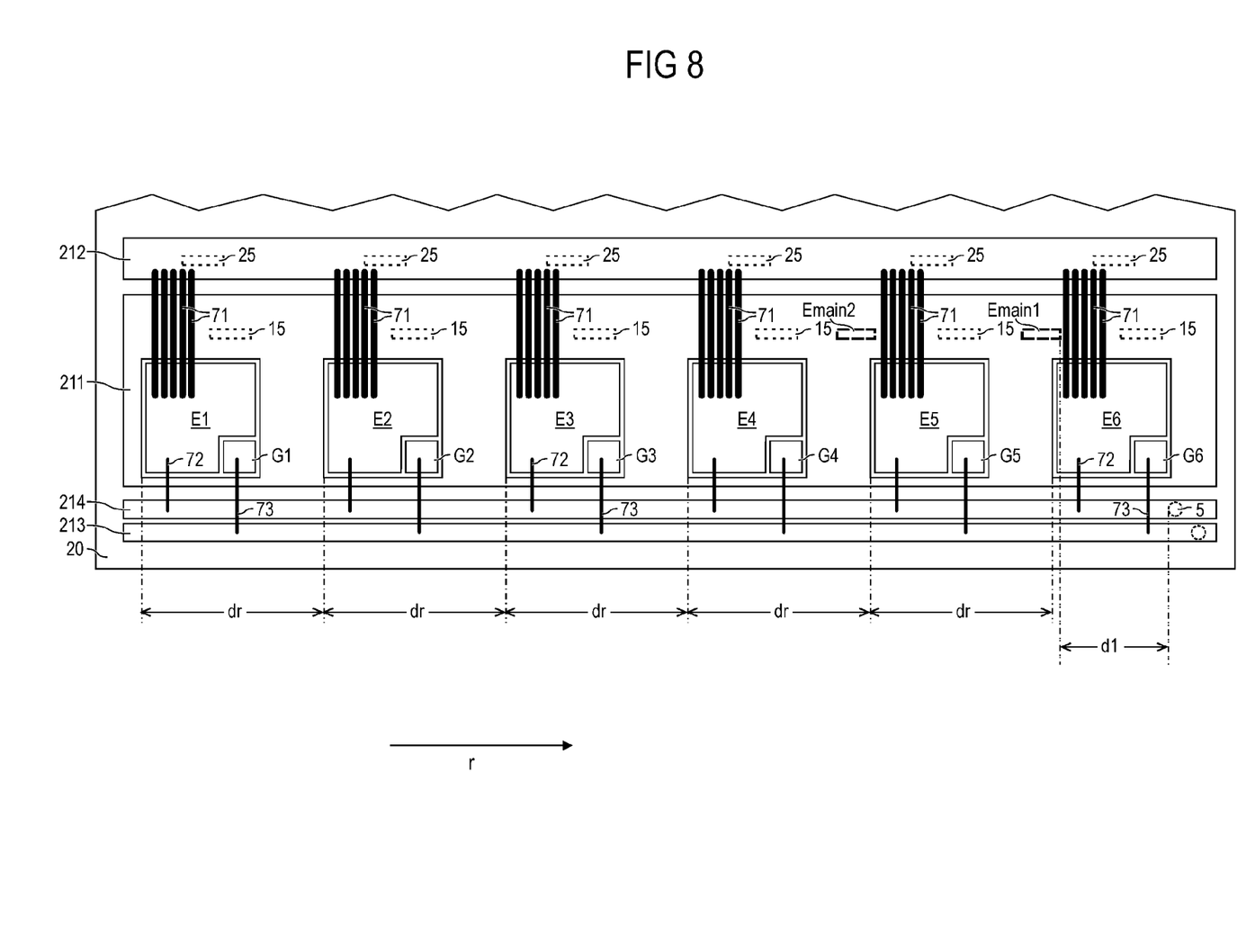
FIG. 8 is a top view of a section of the substrate of FIG. 7 and the semiconductor chips arranged thereon.

The top view of FIG. 8 is identical to the top view of FIG. 4 with the difference being that FIG. 8 shows the positions of both the first main load contacts Emain1 and Emain2 instead of only a single main load contact Emain.

Even though the controllable semiconductor chips T1 . . . T6 in the described embodiments are IGBTs, any other kind of semiconductor chips like arbitrary transistors, metal oxide field-effect transistors (MOSFETs), junction field-effect transistors (JFETs), or thyristors may also be used instead.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", an and the are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module, comprising:
   a module housing;
   at least one substrate having a dielectric insulation carrier and a plane topside metallization layer attached to the insulation carrier and which comprises a number of conductor tracks;
   a number N of at least two controllable power semiconductor chips arranged inside the module housing and one after another in a lateral direction, wherein each of the number of N controllable power semiconductor chips is arranged on the top metallization layer of one of the at least one substrate and comprises a first main electrode, a second main electrode, a load path formed between the first main electrode and the second main electrode, and a control electrode for controlling an electric current through the load path, and wherein the first main electrodes are electrically connected to one another, the second main electrodes are electrically connected to one another, and the control electrodes are electrically connected to one another;
   a single main load terminal arranged outside the module housing and electrically connected to the first main electrodes;
   an auxiliary terminal arranged outside the module housing and electrically connected to the first main electrodes via an auxiliary terminal connecting conductor, the auxiliary terminal connecting conductor being connected to one of the at least one topside metallization layer at a connection location of that topside metallization layer; and
   wherein the main load terminal is spaced distant from the connection location in the lateral direction at a distance that is less than or equal to a smallest repeat distance that occurs between any two adjacent ones of the power semiconductor chips in the lateral direction.

2. The power semiconductor module as claimed in claim 1, wherein $N \geq 3$.

3. The power semiconductor module as claimed in claim 1, wherein N is odd.

4. The power semiconductor module as claimed in claim 1, wherein N is even.

5. The power semiconductor module as claimed in claim 1, wherein the power semiconductor module has a single substrate.

6. The power semiconductor module as claimed in claim 1, wherein the power semiconductor module has at least two substrates.

7. The power semiconductor module as claimed in claim 1, wherein the insulation carrier of one, more or each substrate is made of a ceramic material.

8. A power semiconductor module, comprising:
a module housing;
at least one substrate having a dielectric insulation carrier and a plane topside metallization layer attached to the insulation carrier and, that comprises a number of conductor tracks;
a number N of at least two controllable power semiconductor chips arranged inside the module housing and one after another in a lateral direction, wherein each of the number of N controllable power semiconductor chips is arranged on the top metallization layer of one of the at least one substrate and comprises a first main electrode, a second main electrode, a load path formed between the first main electrode and the second main electrode, and a control electrode for controlling an electric current through the load path, and wherein the first main electrodes are electrically connected to one another, the second main electrodes are electrically connected to one another, and the control electrodes are electrically connected to one another;
two first main load terminals arranged outside the module housing, wherein a first one of the first main load terminals is electrically connected to the first main electrodes via a first main terminal connecting conductor and a second one of the first main load terminals is electrically connected to the first main electrodes via a second main terminal connecting conductor;
a second main load terminal arranged outside the module housing and electrically connected to the second main electrodes;
an auxiliary terminal arranged outside the module housing and electrically connected to the first main electrodes via an auxiliary terminal connecting conductor;
wherein the auxiliary terminal connecting conductor is connected to one of the at least one topside metallization layer at a connection location of that topside metallization layer;
wherein the module is configured such that if the first main load terminals are short-circuited outside the module housing:
a first terminal of an ohmic load is connected to both first main load terminals;
a first electric supply potential is connected to a second terminal of the ohmic load;
a second electric supply potential is connected to the second main load terminal; and
each of the power semiconductor chips is fully switched on such that through the load path of each of the power semiconductor chips an electric current caused by the first and second electric supply potentials establishes;
wherein a total electric current through the ohmic load establishes which is the sum of a first partial current through the first main terminal connecting conductor and a second partial current through the second main terminal connecting conductor, the first partial current being greater than the second partial current; and
wherein the first main load terminal is spaced distant from the connection location in the lateral direction at a distance that is less than or equal to a smallest repeat distance that occurs between any two adjacent ones of the power semiconductor chips in the lateral direction.

9. The power semiconductor module as claimed in claim 8, wherein $N \geq 3$.

10. The power semiconductor module as claimed in claim 8, wherein N is odd.

11. The power semiconductor module as claimed in claim 8, wherein N is even.

12. The power semiconductor module as claimed in claim 8, wherein the power semiconductor module has a single substrate.

13. The power semiconductor module as claimed in claim 8, wherein the power semiconductor module has at least two substrates.

14. The power semiconductor module as claimed in claim 8, wherein the insulation carrier of one, more or each substrates is made of a ceramic material.

* * * * *